(12) United States Patent
Shirakawa et al.

(10) Patent No.: US 6,229,116 B1
(45) Date of Patent: May 8, 2001

(54) HEAT TREATMENT APPARATUS

(75) Inventors: Eiichi Shirakawa; Nobuyuki Sata, both of Kumamoto (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/243,548

(22) Filed: Feb. 3, 1999

(30) Foreign Application Priority Data

Feb. 3, 1998 (JP) .................................. 10-021933

(51) Int. Cl.[7] ...................................... F27B 5/04
(52) U.S. Cl. .................... 219/390; 374/179; 118/728; 219/446.1; 219/510
(58) Field of Search .................. 219/390, 413, 219/510, 446.1, 448.11, 448.12, 483, 490, 494, 495, 497, 505; 374/179, 181, 182; 118/728; 438/660, 715; 392/416

(56) References Cited

U.S. PATENT DOCUMENTS

| | | | |
|---|---|---|---|
| 5,294,778 | * 3/1994 | Carman et al. | 219/385 |
| 5,536,918 | * 7/1996 | Ohkase et al. | 219/390 |
| 5,558,717 | * 9/1996 | Zhao et al. | 118/715 |
| 5,593,608 | * 1/1997 | Suzuki | 219/492 |

* cited by examiner

Primary Examiner—Teresa Walberg
Assistant Examiner—Shawntina Fuqua
(74) Attorney, Agent, or Firm—Rader, Fishman & Grauer

(57) ABSTRACT

A heating treatment apparatus comprises a hot plate on which a substrate to be processed is to be mounted, a heater for heating the hot plate, a plurality of first sensors for detecting temperatures of a plurality of portions of the hot plate, respectively, a second sensor for detecting temperature of a representative portion of the hot plate, and a controller for controlling a heat generating operation of the heater on the basis of a plurality of first detection temperatures detected by the first sensors respectively and a second detection temperature detected by the second sensor, thereby controlling temperature of the hot plate.

16 Claims, 7 Drawing Sheets

HEAT TREATMENT APPARATUS

BACKGROUND OF THE INVENTION

The present invention relates to a heat treatment apparatus such as a baking apparatus and a prebaking apparatus to be incorporated into a semiconductor manufacturing system for manufacturing a semiconductor device.

In a photolithography process for manufacturing a semiconductor device and an LCD, resist is coated on a substrate, and the resultant resist coating film is exposed to light and developed. Such a series of processing is carried out in a coating/developing system. The coating/developing system has heating sections such as a prebaking unit and a post-baking unit. Each of these heating sections has a hot plate with a built-in heater of a resistance heating type.

Recently, semiconductor device circuits have been miniaturized more and more. Their pattern wiring is formed in a width of the sub micron order. Under the circumstances, it has been strongly desired to control the heat treatment temperature of the photoresist film more accurately. The wafers W (objects to be treated) are usually treated in units (lots) each consisting of, e.g., 25 wafers. Each lot is processed under the same recipe (individual treatment program). Prebaking and postbaking are performed under heat treatment conditions according to individual recipes. The wafers belonging in the same lot are heated under the same conditions.

According to each of the recipes, the heat treatment temperature may be varied within such an acceptable range that the temperature will have no effect on a final semiconductor device. In other words, a desired temperature may differ from a heat treatment temperature in practice. When the wafer is treated with heat beyond the acceptable temperature range, a desired photoresist film cannot be obtained. Then, to obtain the desired photoresist film, a thermocouple is used for detecting the temperature of the hot plate. On the basis of the detected temperature, the power supply to the heater can be controlled in a feed-back manner. To describe more strictly, since the temperature of the entire hot plate is not uniform and varies with the passage of time, it is difficult to determine the temperature of the hot plate by a single thermocouple momentarily.

BRIEF SUMMARY OF THE INVENTION

An object of the present invention is to provide a heat treatment apparatus capable of accurately controlling a heat treatment temperature.

The heat treatment apparatus according to the present invention comprises:

a hot plate on which a substrate to be processed is to be mounted;

a heater for heating the hot plate;

a plurality of first sensors for detecting temperatures of a plurality of portions of the hot plate, respectively;

a second sensor for detecting temperature of a representative portion of the hot plate; and a controller for controlling a heat generating operation of the heater on the basis of a plurality of first detection temperatures which are detected by the first sensors respectively, and a second detection temperature detected by the second sensor, thereby controlling the temperature of the hot plate.

It is preferable that the apparatus further have correction means for correcting each of the first detection temperatures by using the second detection temperature. In this case, the controller controls the heater on the basis of a plurality of first detection temperatures which are corrected by the correction means.

In the present invention, the relative temperatures are detected respectively by the first sensors with respect to portions of the hot plate, whereas a standard temperature of the hot plate is detected by the second sensor. The temperatures detected by the first sensors are corrected by using the standard temperature. The first sensor is advantageous in capturing a temperature distribution of the entire hot plate. The second sensor is advantageous in capturing temperatures of individual portions of the hot plate. In this manner, the first sensor and the second sensor are complemented with each other, so that thermal conditions of the hot plate can be accurately captured. Accordingly, the heat treatment can be applied to the substrate with a high accuracy. Note that at least one film of a photoresist film and an anti-reflection film is formed on the substrate. The heat treatment apparatus of the present invention is used to bake such a film.

In the heat treatment apparatus, various types of temperature sensors may be used in combination. Such sensors to be used in combination include a thermocouple, a temperature indicating resistor, a radiation type temperature sensor, and the like. The thermocouple and the radiation type temperature sensor may be used as the first sensor. The temperature indication resistor may be used as the second sensor.

As the thermocouple, a chromel-alumel thermocouple, a platinum-platinum·10% rhodium thermocouple, a platinum-platinum·13% rhodium thermocouple, and a copper-constantan thermocouple may be mentioned. Two different thermocouples selected from these thermocouples may be used in combination. Alternatively, one thermocouple may be used in combination with the temperature indicating resistor. Since the thermocouple is responsible for measuring a heat electromotive force to a standard electromotive force, the thermocouple has a stability (repeatability) to some extent. Thus, the values measured by a plurality of thermocouples do not significantly differ. However, temperature characteristics of the standard electrode are easily degraded, so that absolute accuracy of the temperature measured by the thermocouple is low. Acceptable errors in temperature measured by the thermocouple are, for example, ±0.5° C., ±1.0° C., and ±1.5° C. Since the thermocouple is low in absolute accuracy with respect to measured temperature in a high-temperature range, the reliability of the thermocouple is poor in a temperature range of 300° C. or more.

As a representative temperature indicating resistor, platinum is mentioned. In the thermo-sensor having a temperature indicating platinum resistor (hereinafter, referred to as "Pt sensor"), since temperature characteristics of the temperature indicating platinum resistor rarely change, the absolute accuracy of the measurement temperature is high. Acceptable errors in the temperature measured by the Pt sensor are, for example, ±0.35° C., ±0.50° C., and ±0.75° C. However, it is not preferable that a plurality of Pt sensors be used in combination since there is a significant difference in temperature characteristics between a certain Pt sensor and another Pt sensor. In addition, the Pt sensor is more expensive and bigger than the thermocouple.

Since the radiation type temperature sensor cannot be used in measuring an absolute value of the temperature directly unless a surface radiation rate of an object to be measured is known, the sensor is a relative temperature measurement means. Hence, the radiation type temperature sensor can be used in place of the thermocouple. However, the temperature sensor of this type is susceptible for effects of foreign matters interposed between the sensor and the object to be measured.

As the substrate to be treated, a semiconductor wafer and an LCD glass substrate are used. Usually such a substrate has a photoresist film or an anti-reflection film coated thereon. Hence, if such a film is baked at a desired heat treatment temperature, the film can be obtained in a desired quality and thickness.

It is preferable that a contact-type sensor be used as the first and second sensors since the contact-type sensor has a small error in measurement. However, a non-contact sensor may be used as the first sensor.

The first and second sensors may be fitted at any place of the hot plate. For example, a plurality of first sensors are fitted to the hot plate so as to be arranged along a radius thereof and the second sensor is fitted to the hot plate concentrically with one of the first sensors. The first sensors are fitted onto an upper surface of the hot plate and the second sensor is fitted to a side surface or a bottom surface of the hot plate. Furthermore, a plurality of first sensors are fitted to the hot plate so as to be arranged along a radius thereof and the second sensor may be fitted to the hot plate concentrically with one of the first sensors.

It is preferable that a resistance heater such as a dichromatic wire be used as the heater. The heater has a plurality of resistance heating elements whose power supply is individually controlled by a controller. Each of the resistance heating elements may be fitted to the hot plate so as to heat different portions of the hot plate, individually. In this case, the resistance heating elements are arranged in the regions divided into the concentric circular forms, individually, and then, the first sensors may be arranged in the concentrically divided regions, individually. On the other hand, a heat medium may be supplied to an inner flow passage of the hot plate in a circulation manner and heated by the heater.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferred embodiments of the present invention will be explained with reference to the accompanying drawing.

Figure 1:
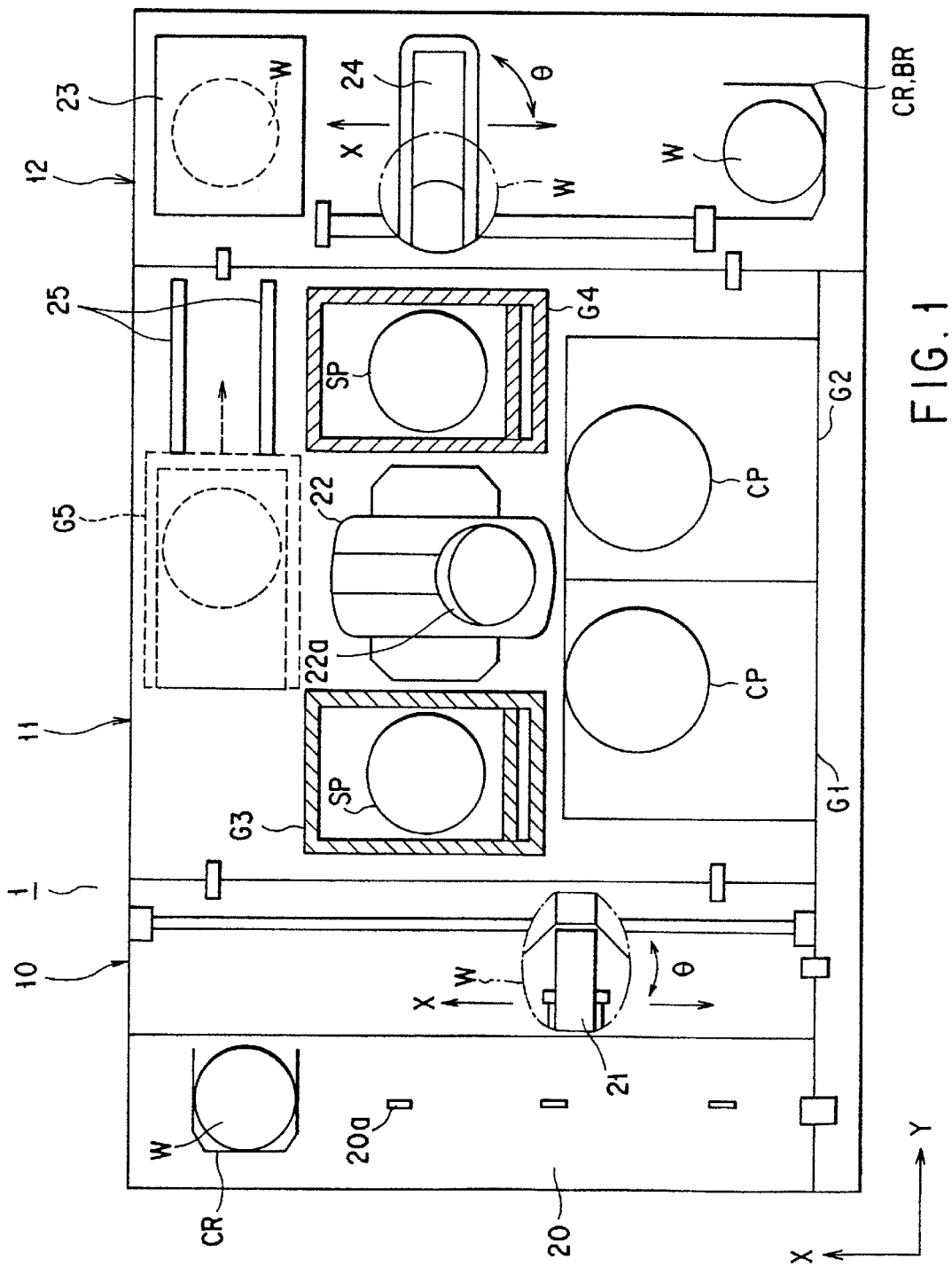
FIG. 1 is a schematic plan view of a coating/developing system.
Figure 2:
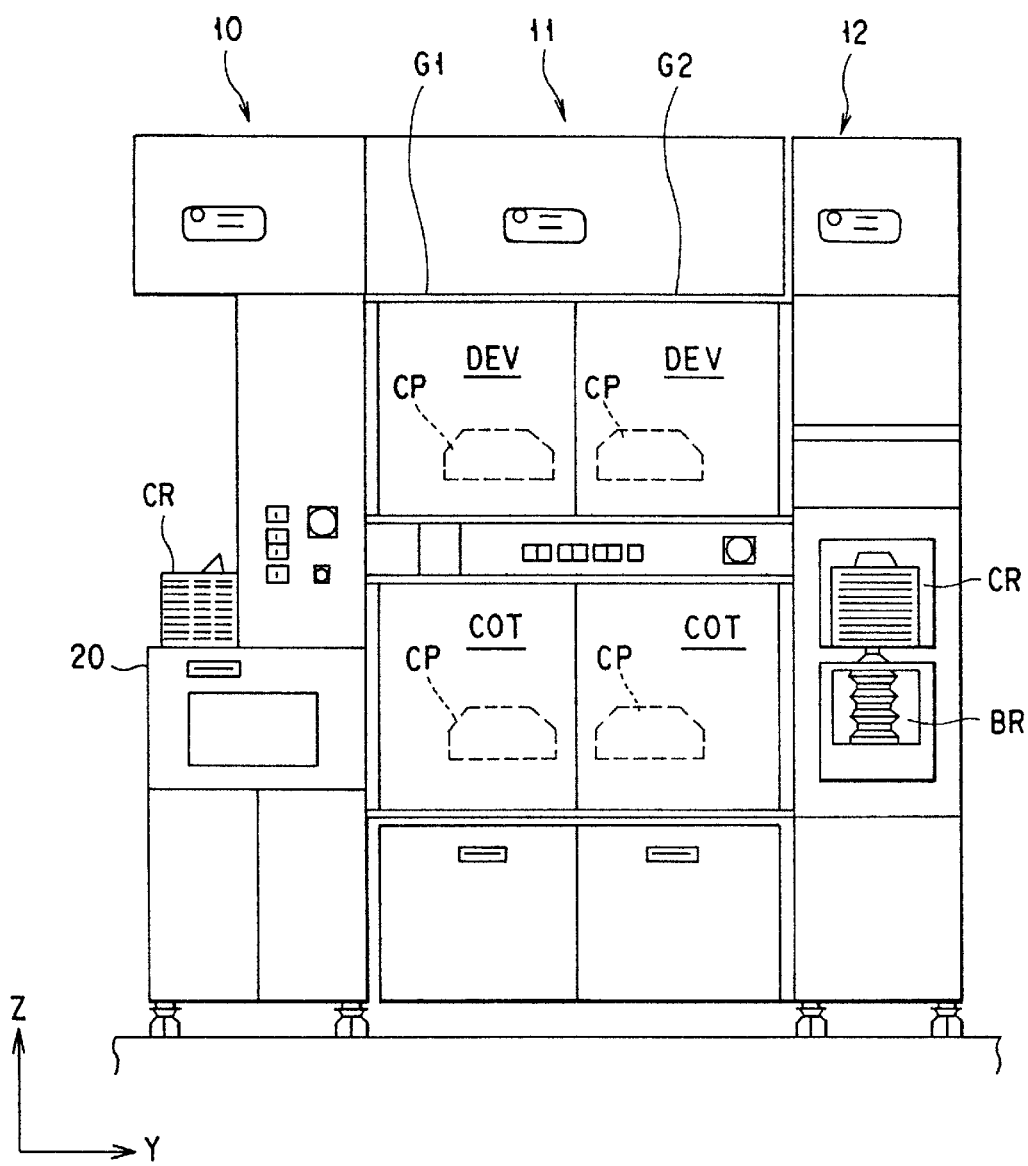
FIG. 2 is a front view of the coating/developing system.
Figure 3:
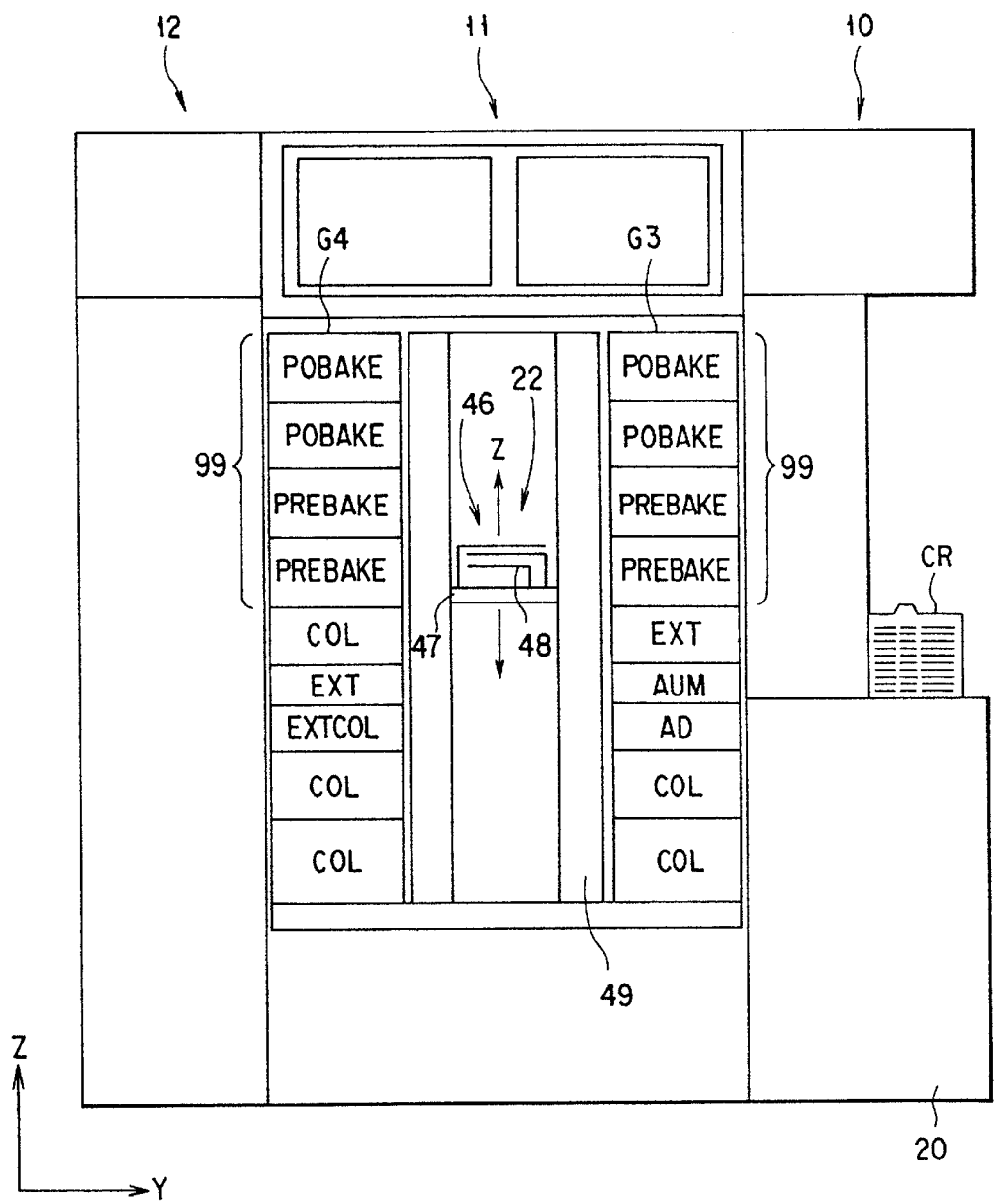
FIG. 3 is a rear view of the coating/developing system.

As shown in FIGS. 1–3, a coating/developing system 1 has a load/unload section 10, a process section 11, and an interface section 12. The load/unload section 10 has a cassette table 20 on which cassettes CR storing e.g., 25 semiconductor wafers W for each, are loaded/unloaded. The process section 11 has various single wafer processing units for processing wafers W sequentially one by one. The interface section 12 is interposed between the process section 11 and a light-exposure apparatus (not shown).

Four projections 20a are formed on the cassette table 20. Four cassettes CR are positioned respectively at right places to the process section 11 by means of these projections 20a. Each of the cassettes CR mounted on the table 20 has a load/unload opening facing the process section 11.

In the load/unload section 10, a first sub-arm mechanism 21 is formed which is responsible for loading/unloading the wafer W into/from each cassette CR. The first sub arm mechanism 21 has a holder portion for holding the wafer W, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a θ rotation mechanism (not shown) for swinging the holder portion around the Z-axis.

The first sub-arm mechanism 21 can gain access to an alignment unit (ALIM) and an extension unit (EXT) belonging to a third process unit group G3.

As shown in FIG. 3, a main arm mechanism 22 is liftably arranged at the center of the process section 11. Five process units G1–G5 are arranged around the main arm mechanism 22. The main arm mechanism 22 is arranged within a cylindrical supporting body 49 and has a liftable wafer transporting apparatus 46. The cylindrical supporting body 49 is connected to a driving shaft of a motor (not shown). The driving shaft can be rotated about the Z-axis in synchronism with the wafer transporting apparatus 46 by an angle of θ. The wafer transporting apparatus 46 has a plurality of holder portions 48 movable in a front and rear direction of a transfer base table 47.

Units belonging to first and second process unit groups G1, G2, are arranged at the front side of the system 1. Units belonging to a third process unit group G3 are arranged next to the load/unload section 10. Units belonging to a fourth process unit group G4 are arranged next to the interface section 12. Units belonging to a fifth process unit group G5 are arranged at a back side of the system 1.

As shown in FIG. 2, the first process unit group G1 has two spinner-type process units for applying a predetermined treatment to the wafer W mounted on a spin chuck within the cup CP. In the first process unit G1, for example, a resist coating unit (COT) and a developing unit (DEV) are stacked in two stages sequentially from the bottom. In the second process unit group G2, two spinner type process units such as a resist coating unit (COT) and a developing unit (DEV), are stacked in two stages sequentially from the bottom. The resist coating unit (COT) is preferably set at a lower stage than the developing unit (DEV). This is because a discharge line for the resist waste solution is desired to be shorter than a developing waste solution since the resist waste solution is more difficult to discharge than the developing waste solution. However, if necessary, the resist coating unit (COT) may be arranged at the upper stage than the developing unit (DEV).

As shown in FIG. 3, the third process unit group G3 has a cooling unit (COL), an adhesion unit (AD), an alignment unit (ALIM), an extension unit (EXT), a prebaking unit (PREBAKE), and postbaking unit (POBAKE) which are stacked sequentially from the bottom.

Similarly, the fourth process unit group G4 has a cooling unit (COL), an extension cooling unit (EXTCOL), an extension unit (EXT), a cooling unit (COL), a prebaking unit (PREBAKE) and a postbaking unit (POBAKE).

As mentioned, it is preferable that the cooling unit (COL) and the extension cooling unit (EXTCOL) to be operated at low processing temperatures, be arranged at lower stages and the baking unit (PREBAKE), the postbaking unit (POBAKE) and the adhesion unit (AD) to be operated at high temperatures, be arranged at the upper stages. With this arrangement, thermal interference between units can be reduced. Note that the present invention is concerned with a heating section 99 arranged at the upper stages of the third and fourth process unit groups G3, G4.

At the front side of the interface section 12, a movable pick-up cassette CR and an non-movable buffer cassette BR are arranged in two stages. At the back side of the interface section 12, a peripheral light exposure apparatus 23 is arranged. At the center portion of the interface section 12, a second sub-arm mechanism 24 is provided, which is movable independently in the X and Z directions, and which is capable of gaining access to both cassettes CR and BR and the peripheral light exposure apparatus 23. In addition, a second sub-arm mechanism 24 is rotatable around the Z-axis by an angle of θ and is designed to be able to gain access not only to the extension unit (EXT) belonging to the fourth processing unit G4 and but also to a wafer transfer table (not shown) near the light exposure apparatus (not shown).

In the system 1, the fifth processing unit group G5 can be arranged at the back side of the main arm mechanism 22. The fifth processing unit G5 can be slidably shifted in the Y-axis direction along a guide rail 25. Since the fifth processing unit group G5 can be shifted as mentioned, maintenance operation can be applied to the main arm mechanism 22 easily from the back side.

As described, the cooling unit (COL) and the extension cooling unit (EXTCOL) to be operated at low processing temperatures, are arranged at lower stages and the baking unit (PREBAKE), the postbaking unit (POBAKE) and the adhesion unit (AD) to be operated at high temperatures, are arranged at the upper stages. With this arrangement, thermal interference between units can be reduced. Of course, these units may be arranged in multiple stages at random.

Now, referring to FIGS. 4 and 5, baking units (PREBAKE, POBAKE) belonging to the heating section 99 will be explained.

The heating section 99 includes the baking unit (PREBAKE), the postbaking unit (POBAKE), and the adhesion unit (AD) in which the wafer W are heated to temperatures at least higher than room temperature. In the processing chamber 50 of the heating section 99, a hot plate 58 having a resistance heater 93 embedded therein is placed in the processing chamber 50.

The hot plate 58 is constructed in the jacket form having a hollow 58a and a recess 58b. The wafer W may be heated by supplying a heat medium to the recess 58b in a circulation manner. In this case, the hot plate 58 may be heated by inserting a heater 93 or a heat pipe (not shown) into the recess 58b. More specifically, the hot plate 58 is heated to a predetermined heat treatment temperature by allowing the hollow filled with vapor generated from a heat medium by application of heat thereto at the recess 58b.

The processing chamber 50 is defined by a side wall 52, a horizontal shielding plate, and a cover 68. Openings 50A, 50B are formed at a front surface side (aisle side of the main arm mechanism 22) and a rear surface side of the processing chamber, respectively. The wafer W is loaded into and unloaded from the processing chamber 50 through the openings 50A, 50B. A circular opening 56 is formed at the center of the horizontal shielding plate 55. The hot plate 58 is housed in the opening 56. The hot plate 58 is supported by the horizontal shielding plate 55 with the aid of a supporting plate 76.

The hot plate 58 has three through-holes 60. Three lift pins 62 are inserted into the three through-holes 60, respectively. Three lift pins 62 are connected to and supported by an arm 80, which is further connected to and supported by a rod 84a of a vertical cylinder 84. When the rod 84a is allowed to protrude from the cylinder 84, the lift pins 62 protrude from the hot plate 58, thereby lifting the wafer W.

A ring-form shutter 66 is attached to the outer periphery of the hot plate 58. A plurality of air holes 64 are formed along the periphery of the shutter 66 at intervals of central angles of 2°. The air holes 64 communicate with a cooling gas supply source (not shown).

The shutter 66 is liftably supported by a cylinder 82 via an arm 78. The shutter 66 is positioned at a place lower than the hot plate 58 at non-operation time, whereas, at an operation time, it is lifted up to a position higher than the hot plate 58 and between the hot plate 58 and the cover 68. When the shutter 66 is lifted up, nitrogen gas or air (cooling gas) blows out from the air holes 64.

An exhaust port 68a is opened at the center of the cover 68 so as to communicate with the exhaust pipe 70. Gas generated from the surface of the wafer W at the heat treatment detected temperature time is exhausted through the exhaust port 68a. The exhaust pipe 70 communicates with a duct 53 (or 54) at the front surface side (the side the main arm mechanism 22 is provided) of the apparatus or another duct (not shown).

A machine room 74 is formed below the horizontal shielding plate 55. The machine room 74 is defined by the shielding plate 55, two side walls 53, and a bottom plate 72. In the machine room 74, a hot plate supporting plate 76, a shutter arm 78, a lift pin arm 80, a liftable cylinders 82, 84, are arranged.

Figure 4:
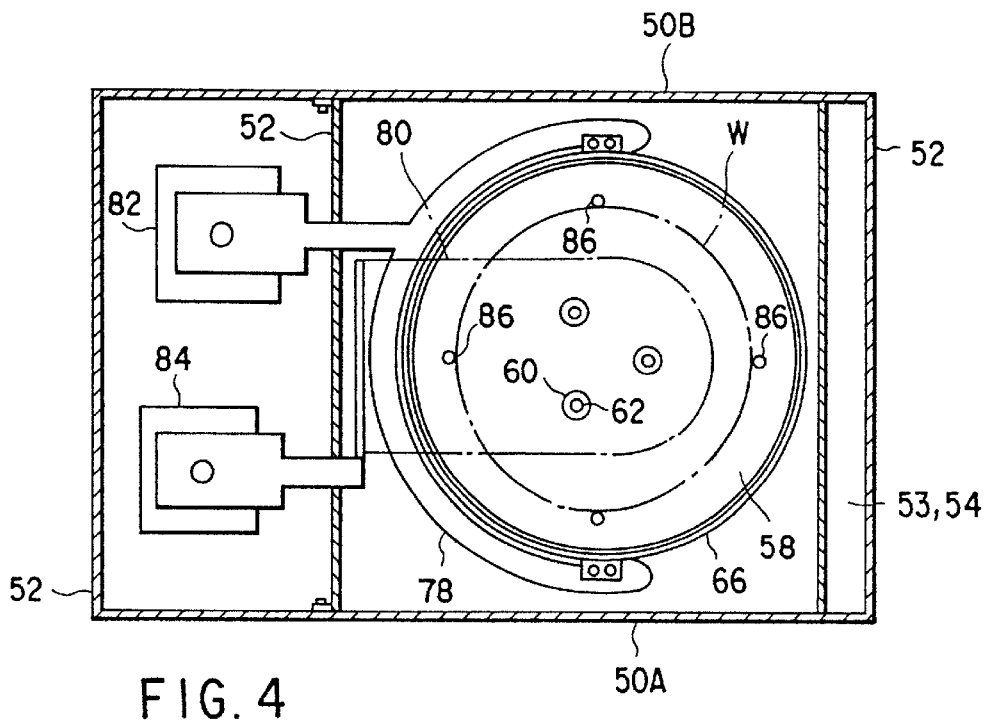
FIG. 4 is a perspective plan view of a baking unit.
Figure 5:
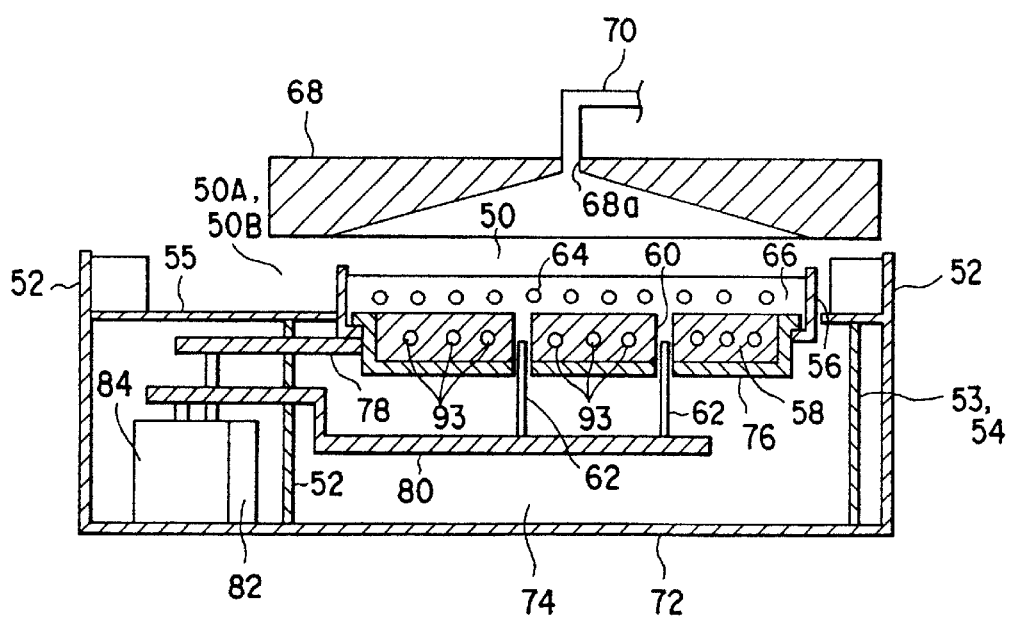
FIG. 5 is a perspective cross-sectional view of the baking unit.

As shown in FIG. 4, four projections 86 are formed on an upper surface of the hot plate 58. The wafer W can be positioned at a right place by means of the four projections 86. In addition, a plurality of small projections (not shown) are formed on the upper surface of the hot plate 58. When the wafer W is mounted on the hot plate 58, top portions of these small projections come in touch with the wafer W. By virtue of the presence of the small projections, a small gap is formed between the wafer W and the hot plate 58. It is therefore possible to prevent the lower surface of the wafer W from being stained and damaged.

Figure 6:
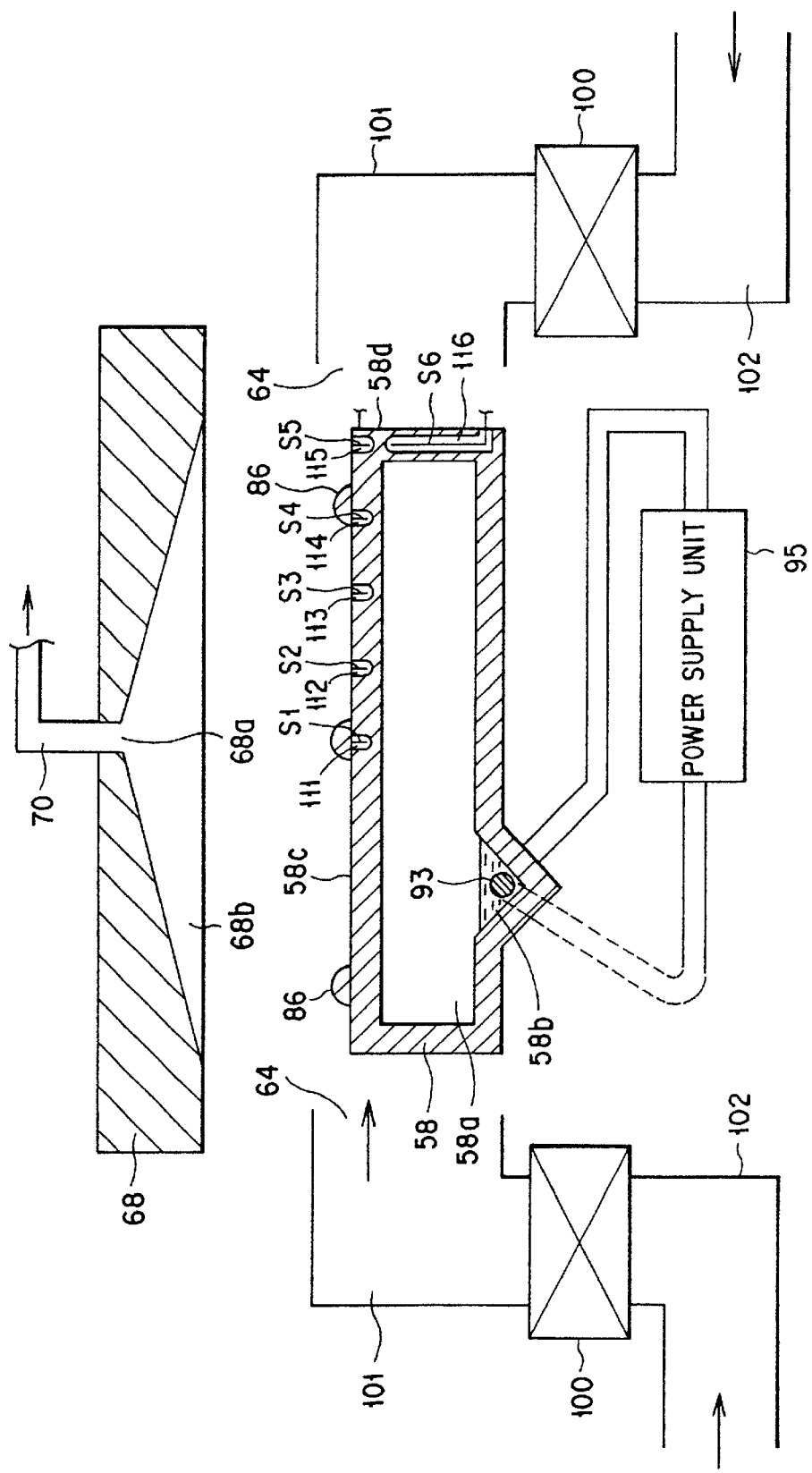
FIG. 6 is a schematic cross-sectional view of a heat treatment apparatus according to an embodiment of the present invention, accompanying a block diagram of peripheral structural elements.
Figure 8:
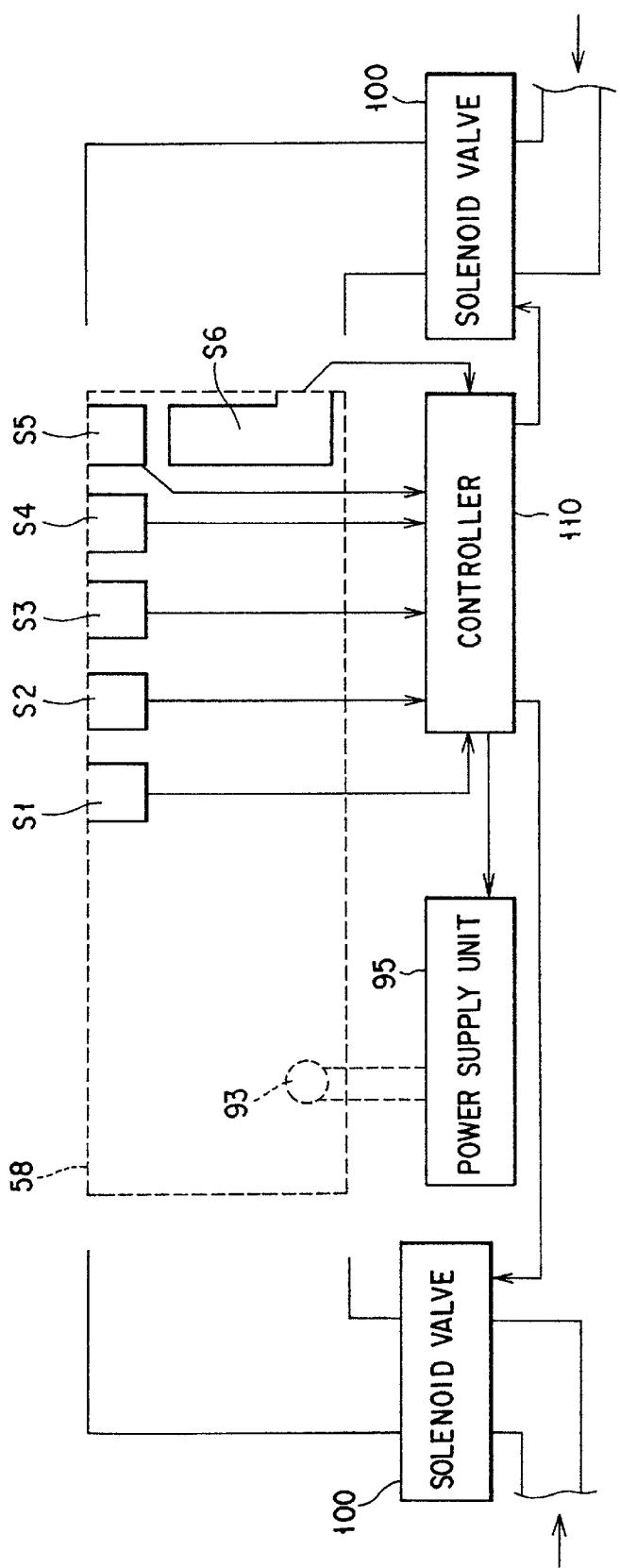
FIG. 8 is a block diagram of a control system of the heat treatment apparatus according to the embodiment of the present invention.

As shown in FIG. 6, six temperature sensors S1, S2, S3, S4, S5, S6 are fitted to the hot plate 58 of the heating section 99. As shown in FIG. 8, a signal line of each of the sensors S1 to S6 is input into an input portion of a control unit 110. To the input portion of the control unit 110, a signal line from a sensor (not shown) of the main arm mechanism 22 is also connected in order to input a signal for a count number of rotational operation of a driving section 22m. Furthermore, a data-input key board (not shown) is connected to the input section of the control unit 110 so as to input data for the recipe corresponding to each of lots.

A depressed portion 68b of a conical shape is formed in the lower portion of the cover 68, as shown in FIG. 6. An exhaust port 68a is formed near the top of the cone. To the exhaust port 68a, a lower end of an exhaust tube 70 is connected. The other end of the exhaust tube 70 communicates with an evacuation unit (not shown). The gas is heated by the hot plate 58, moved up, collected at the depressed portion 68b, and exhausted outside by way of the exhaust port 68a and the exhaust tube 70.

The hollow 58a is formed airtight in an inner space of the hot plate 58. The recess 58b having a V-shape cross-section is formed at the bottom of the hollow 58a. A resistance heater 93 is inserted into the recess 58b. The heater 93 is connected to a power supply unit 95 controlled by a controller 110.

When power is supplied from the power supply unit 95 to the heater 93, the heater 93 generates heat to vaporize the heat medium. As a result, the hollow 58a is filled with the vapor of the heat medium. When the vapor from the heat medium comes in contact with the inner wall surrounding the hollow 58a, the vapor is condensed and liquefied. At this time, a predetermined heat quantity is given to the hot plate 58 from the heat medium. The heat quantity is a value determined depending upon components of the heat medium. Therefore, when a heat cycle consisting of a series of processes starting from the vaporization of the heat medium to the condensation thereof reaches stable and constant conditions, the temperature of the hot plate 58 becomes stable.

Figure 7:
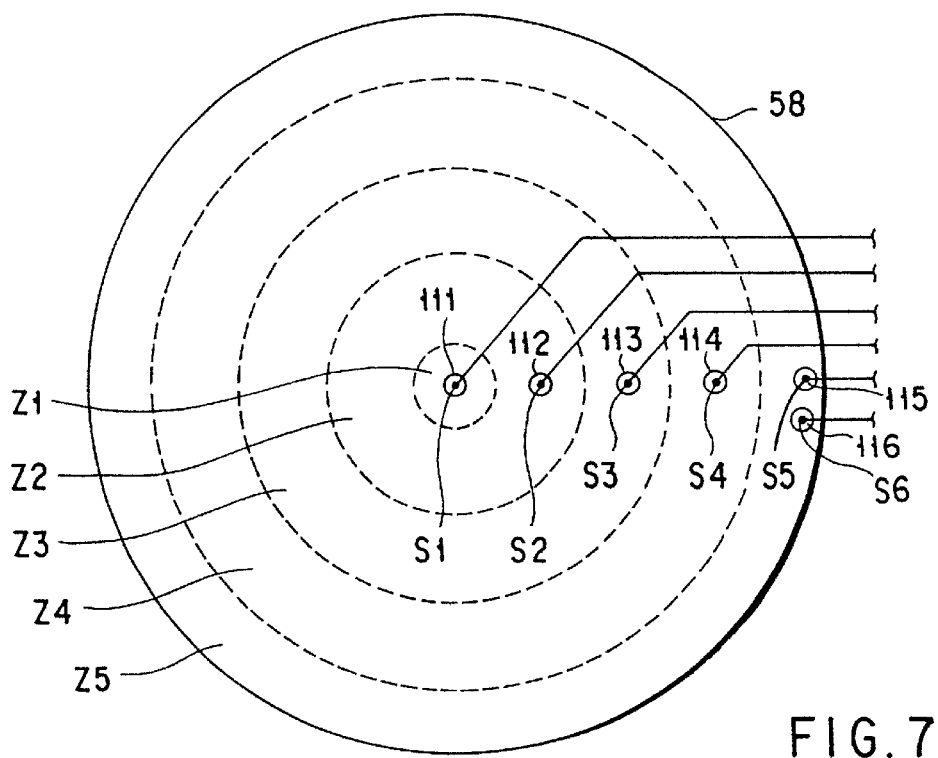
FIG. 7 is a schematic plan view showing a hot plate of the heat treatment apparatus according the embodiment of the present invention.

As shown in FIGS. 6 and 7, five small holes 111, 112, 113, 114, 115 are formed at regular intervals linearly in a radium direction of the hot plate 58. In the small holes 111, 112, 113, 114 and 115, thermocouples S1, S2, S3, S4, and S5 are respectively inserted. These thermocouples S1 to S5 are derived from the same manufacturing lot, so that temperature characteristics of the thermocouples S1 to S5 are substantially equal. Each of the thermocouples S1 to S5 is connected to the controller 110, as shown in FIG. 8.

A small hole 116 is formed at the side surface 58d of the hot plate 58. The small hole 116 is extended in the vertical direction. A Pt sensor S6 is inserted in the small hole 116. The Pt sensor S6 is also connected to the controller 110. The detecting portions of the Pt sensor S6 and the thermocouple S5 are arranged on concentric circles of the hot plate 58 next to each other.

A ventilation duct 101 is provided around the hot plate 58. Air or nitrogen gas is blown to a side surface of the hot plate 58 through the ventilation duct by way of the ventilation port 64. The ventilation duct 101 communicates with an air supply source (not shown) at the upstream. An solenoid valve 100 is interposed between a duct 102 (positioned at the upstream side) and the ventilation duct 101. A flow rate of gas flowing from the duct 102 to the ventilation duct 101 is controlled or shut out by the solenoid valve 100.

When gas (room temperature) is blown to the side surface of the hot plate 58 through the air holes 64, the supplied gas is heated by the hot plate 58, thereby increasing in temperature. The gas increased in temperature exchanges heat with the wafer W mounted on the hot plate 58, with the result that temperature of the wafer W increases.

As shown in FIG. 8, the controller 110 is connected to the thermocouples S1 to S5, the Pt sensor S6, the power supply unit 95, and the solenoid valve 100, individually. The controller 110 controls operations of the power supply unit 95 and the solenoid valve 100 individually on the basis of temperature data input from the thermocouples S1 to S5 and the Pt sensor S6.

Figure 9:
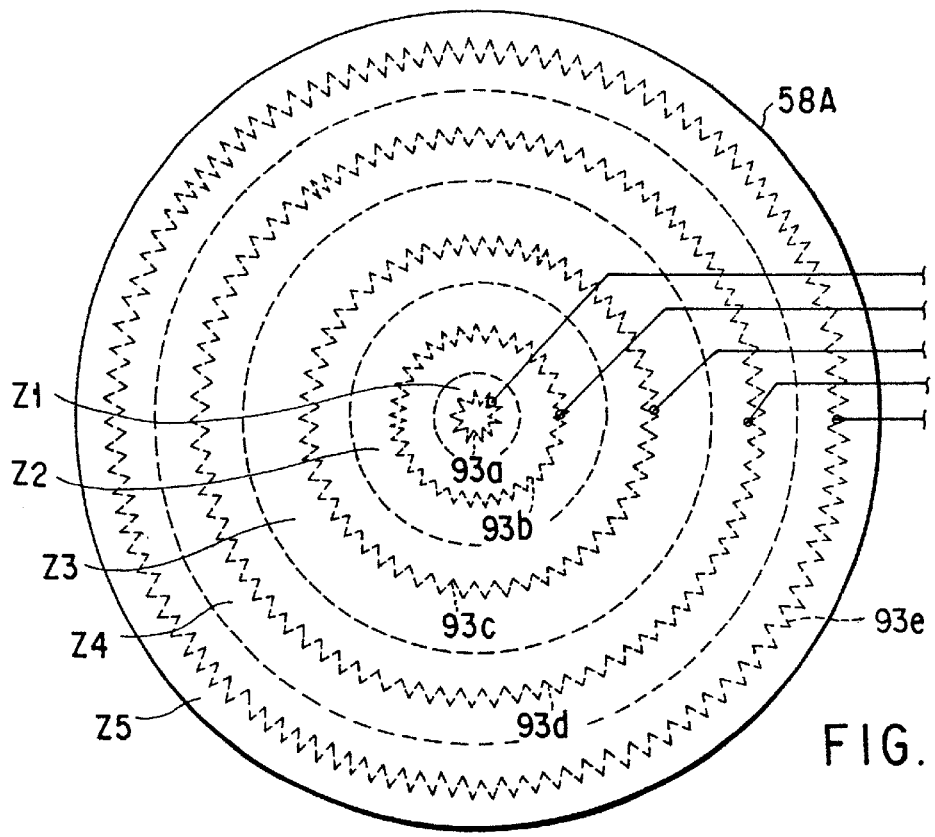
FIG. 9 is a schematic plan view of a hot plate of the heat treatment apparatus according to another embodiment of the present invention.

As shown in FIG. 9, the hot plate 58A according to another embodiment has five concentric regions Z1, Z2, Z3, Z4 and Z5. Resistance heaters 93a, 93b, 93c, 94d, 93e are embedded in the regions Z1, Z2, Z3, Z4 and Z5, respectively. These resistance heaters 93a to 93e are connected to the power supply unit 95 and controlled individually by the controller 110. Therefore, temperature of the hot plate 58A of this type can be controlled more accurately.

Next, we will explain the case where the photoresist film of the wafer W is treated with heat by the use of the aforementioned apparatus.

When a main switch of the coating/developing system 1 is turned on, power is supplied from each of the power sources to the corresponding units in the heating section 99. The shutter 56 is opened and the arm holder 22a is inserted into a processing chamber 50 to lift pins 62. Subsequently, the wafer W is transferred from the arm holder 22 onto the pins 62. The wafer W is transferred onto the hot plate 58 by withdrawing the arm holder 22a from the processing chamber 50 and moving the pins 62 down. At this time, temperature of the hot plate 58 of each unit of the heating section 99 is controlled at a predetermined heat treatment temperature. The hot plate is maintained at, for example, 120° C.

At this time, surface temperatures of the hot plate 58 are detected by the thermocouples S1 to S5 and the Pt sensor S6. More specifically, the temperature distribution of the hot plate 58 in the radius direction is detected by the thermocouples S1 to S5.

Since temperature characteristics of the thermocouples S1 to S5 do not differ significantly, a good temperature distribution is resulted. Note that the thermocouples S1 to S5 are derived from the same lot manufactured at the same time and by using the same material in order to minimize the difference in measurement accuracy between sensors.

On the other hand, the Pt sensor S6 is used to know the surface temperature of the hot plate 58, accurately. A CPU of the controller 110 determiners difference in measurement values between the Pt sensor S6 and the thermocouples S1 to S5. In this manner, correction values for use in obtaining accurate temperatures from the detection values of the thermocouples S1 to S5 can be obtained. More specifically, the detection values determined by the thermocouples S1 to S5 are individually corrected by using the correction values, to obtain accurate temperatures of the regions Z1, Z2, Z3, Z4 and Z5 of the hot plate 58.

Provided that the temperature of the side surface of the hot plate 58 detected by the Pt sensor S6 is represented by TS, the temperatures of the upper surface of the hot plate 58 detected by the thermocouples S1 to S5 are represented by T1 to T5, respectively, and ΔT is defined as a difference between TS and T5, accurate temperatures of the regions Z1 to Z5 can be obtained if ΔT is used as the correction value. In this way, the temperature distribution of the hot plate 58 in the radius direction can be obtained more accurately.

The temperature value detected by the Pt sensor S6 is more accurate than those obtained by the thermocouples S1 to S5, so that the value detected by the Pt sensor S6 is regarded as a standard temperature. On the other hand, since temperature characteristics between the thermocouples S1 to S5 rarely differ, they can be regarded as the same sensor to be used interchangeably. Hence, if temperature of the same portion is detected by the use of the Pt sensor S6 and the thermocouple sensor S5, difference between the detection values can be obtained. As a result, a correction value is thus obtained which is necessary for obtaining the detection value (standard temperature) determined by the Pt sensor S6 on the basis of the detection value by the thermocouple sensor S5. If so, the temperatures to be detected by other thermocouple sensors S1 to S4 are also accurately obtained by the use of the correction value.

If the accurate temperature distribution range thus obtained is beyond the acceptable range, temperature of the hot plate 58 may be controlled by controlling an amount of electric power to be supplied to the heater 93 (placed within the hot plate 58) from the power supply unit 95 or by controlling, for example, a flow rate of the gas to be sent to the hot plate 58.

Since the Pt sensor is expensive, a minimum number of the Pt sensors S6 are used to obtain the standard temperature in the apparatus of the embodiment mentioned above. It is therefore possible to suppress a manufacturing cost of the heat treatment unit at a minimum level.

In the aforementioned embodiment, a semiconductor wafer and a photoresist film are used as an object to be treated. The present invention is not limited to them. An LCD glass substrate and an anti-reflection film may be used as the object.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat treatment apparatus for single substrate processing comprising:
    a hot plate on which substrates to be processed are to be mounted one by one;
    a heater for heating the hot plate;
    a plurality of first sensors for detecting temperatures of a plurality of portions of the hot plate, respectively;
    a second sensor for detecting temperature of a representative portion of the hot plate, said second sensor being located proximate at least one of said plurality of first sensors, wherein said second sensor and at least one of said plurality of first sensors lie at separate points on a circle, the circle centered on a hot plate surface; and
    a controller for controlling a heat generating operation of the heater on the basis of a plurality of first detection temperatures which are detected by the first sensors respectively, and a second detection temperature detected by the second sensor, thereby controlling temperature of the hot plate.

2. The apparatus according to claim 1, further comprising correction means for correcting each of the first detection temperatures by using the second detection temperature; and
    wherein said controller controls the heater on the basis of the first detection temperatures corrected by the correction means.

3. The apparatus according to claim 1, wherein said second sensor detects temperature of the hot plate on the basis of a detection principle different from a principle used in the case of the first sensors.

4. The apparatus according to claim 3, wherein each of said plurality of first sensors is a thermocouple and said second sensor is a temperature indicating platinum resistor.

5. The apparatus according to claim 1, wherein said second sensor detects temperature of the hot plate on the basis of the same detection principle as used in each of the first sensors.

6. The apparatus according to claim 5, wherein each of said plurality of first sensors is a thermocouple, and the second sensor is a thermocouple having an electrode different from an electrode used in each of the first sensors.

7. The apparatus according to claim 1, wherein said plurality of first sensors are individually fitted to the hot plate so as to be arranged along a radius of the hot plate.

8. The apparatus according to claim 1, wherein said heater has a plurality of resistance heaters whose power supply is individually controlled by the controller, and said resistance heaters are fitted to the hot plate so as to heat different portions of the hot plate, individually.

9. The apparatus according to claim 8, further comprising
    correction means for correcting each of the first detection temperatures by the second detection temperature, and
    wherein said controller corrects the resistance heater on the basis of the first detection temperatures corrected by the correction means.

10. The apparatus according to claim 8, wherein the resistance heaters are arranged at regions of the hot plate divided into concentric circular forms, respectively, and the first sensors are arranged respectively on the regions divided into concentric circular forms.

11. The apparatus according to claim 1, further comprising
    an inner flow passage formed on the hot plate and a heat medium supply source for supplying the heat medium into the inner flow passage in a circulation manner; and
    wherein said heater heats the heat medium flowing through the inner flow passage.

12. The apparatus according to claim 11, further comprising correction means for correcting the first detection temperatures respectively by using the second detection temperature; and
    wherein said controller controls the heat medium supply source and the heater on the basis of the first detection temperatures corrected by the correction means.

13. The apparatus according to claim 11, wherein
    said first sensors are fitted to an upper surface of the hot plate, and said second sensor is fitted to a side surface or a bottom surface of the hot plate.

14. The apparatus according to claim 13,
    wherein the first sensors are fitted so as to be arranged along a radius of the hot plate; and
    the second sensor is fitted to the hot plate concentrically with one of the first sensors.

15. The apparatus according to claim 1,
    wherein the first and second sensors have temperature detecting portions respectively for detecting temperatures by being in contact with the hot plate.

16. The apparatus according to claim 1,
    wherein at least one of a photoresist film and an anti-reflection film is formed on the substrate.

* * * * *